United States Patent
Peterson

(10) Patent No.: US 7,098,048 B1
(45) Date of Patent: Aug. 29, 2006

(54) METHOD AND APPARATUS FOR CAPTURING FAULT STATE DATA

(75) Inventor: Anastasia O. Peterson, Spicewood, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/261,611

(22) Filed: Sep. 30, 2002

(51) Int. Cl.
*G01R 31/26* (2006.01)
*H01L 21/66* (2006.01)

(52) U.S. Cl. .............................. 438/14; 438/16; 438/17

(58) Field of Classification Search ................. 438/14, 438/15, 16, 17, 18
See application file for complete search history.

(56) References Cited

U.S. PATENT DOCUMENTS

| | | | | |
|---|---|---|---|---|
| 6,037,790 A * | 3/2000 | Dinan | .................. | 324/757 |
| 6,194,738 B1 * | 2/2001 | Debenham et al. | ........... | 257/48 |
| 6,242,273 B1 * | 6/2001 | Goodwin et al. | ............. | 438/14 |
| 6,365,421 B1 * | 4/2002 | Debenham et al. | ........... | 438/14 |
| 6,537,833 B1 * | 3/2003 | Lensing | .................. | 438/14 |
| 6,560,504 B1 * | 5/2003 | Goodwin et al. | ............ | 700/121 |
| 6,563,300 B1 * | 5/2003 | Jackson et al. | .......... | 324/158.1 |
| 6,876,445 B1 * | 4/2005 | Shibuya et al. | .......... | 356/237.2 |

\* cited by examiner

*Primary Examiner*—Walter L. Lindsay, Jr.
(74) *Attorney, Agent, or Firm*—Williams, Morgan & Amerson

(57) ABSTRACT

A method includes receiving a fault notification message associated with a fault condition in a manufacturing system. Workpiece identification information is determined for at least one workpiece associated with the fault condition based on the fault notification message. Fault state data is collected based on the workpiece identification information. A fault record including the workpiece identification information and the fault state data is stored. A manufacturing system includes a plurality of tools for processing workpieces, a fault database, and a fault monitor. The fault monitor is configured to receive a fault notification message associated with a fault condition in the manufacturing system, determine workpiece identification information for at least one of the workpieces associated with the fault condition based on the fault notification message, collect fault state data based on the workpiece identification information, and store a fault record including the workpiece identification information and the fault state data in the fault database.

27 Claims, 2 Drawing Sheets

METHOD AND APPARATUS FOR CAPTURING FAULT STATE DATA

BACKGROUND OF THE INVENTION

1. Field of the Invention

This invention relates generally to the field of semiconductor device manufacturing and, more particularly, to a method and apparatus for capturing fault state data.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a lot of wafers using a variety of processing tools, including photolithography steppers, etch tools, deposition tools, polishing tools, rapid thermal processing tools, implantation tools, etc. The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of a semiconductor processing line includes using a factory wide control system to automatically control the operation of the various processing tools. The manufacturing tools communicate with a manufacturing framework or a network of processing modules. Each manufacturing tool is generally connected to an equipment interface. The equipment interface is connected to a machine interface which facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

Statistical process control (SPC) techniques are commonly used to monitor the operation of manufacturing processes, systems, or individual manufacturing tools. Commonly, various measurements related to the process being monitored are compiled and analyzed. Fault detection data may include data related to the manufactured devices as well as data related to the operating parameters of the tools. For example, physical measurements, such as line width, or electrical measurements, such as contact resistance, may be used to detect faults in fabricated devices. Tool parameters, such as chamber pressure, temperature, voltage, reactive gas makeup, etc., may be evaluated during the processing of devices in the tool to detect fault conditions with the tools themselves.

Typically, there is a delay between the time a fault condition is determined and corrective action and/or troubleshooting activities are performed. During this delay, the conditions in the fabrication facility may change (i.e., process and/or tool state) from what was present at the time the fault condition was generated. While some of the data regarding the events leading up to the fault condition is archived, other data is not stored at all or is only available for a limited time due to the volume of the incoming data. Even for the data that is archived, it is often time consuming to access all the relevant data sources and correlate the data to the wafer having the associated fault condition. Hence, troubleshooting activities are often hampered by the difficulties associated with incomplete data and the difficulty in gathering the existing data.

The present invention is directed to overcoming, or at least reducing the effects of, one or more of the problems set forth above.

SUMMARY OF THE INVENTION

One aspect of the present invention is seen in a method that includes receiving a fault notification message associated with a fault condition in a manufacturing system. Workpiece identification information is determined for at least one workpiece associated with the fault condition based on the fault notification message. Fault state data is collected based on the workpiece identification information. A fault record including the workpiece identification information and the fault state data is stored.

Another aspect of the present invention is seen in a manufacturing system including a plurality of tools for processing workpieces, a fault database, and a fault monitor. The fault monitor is configured to receive a fault notification message associated with a fault condition in the manufacturing system, determine workpiece identification information for at least one of the workpieces associated with the fault condition based on the fault notification message, collect fault state data based on the workpiece identification information, and store a fault record including the workpiece identification information and the fault state data in the fault database.

BRIEF DESCRIPTION OF THE DRAWINGS

The invention may be understood by reference to the following description taken in conjunction with the accompanying drawings, in which like reference numerals identify like elements, and in which.

Figure 1:
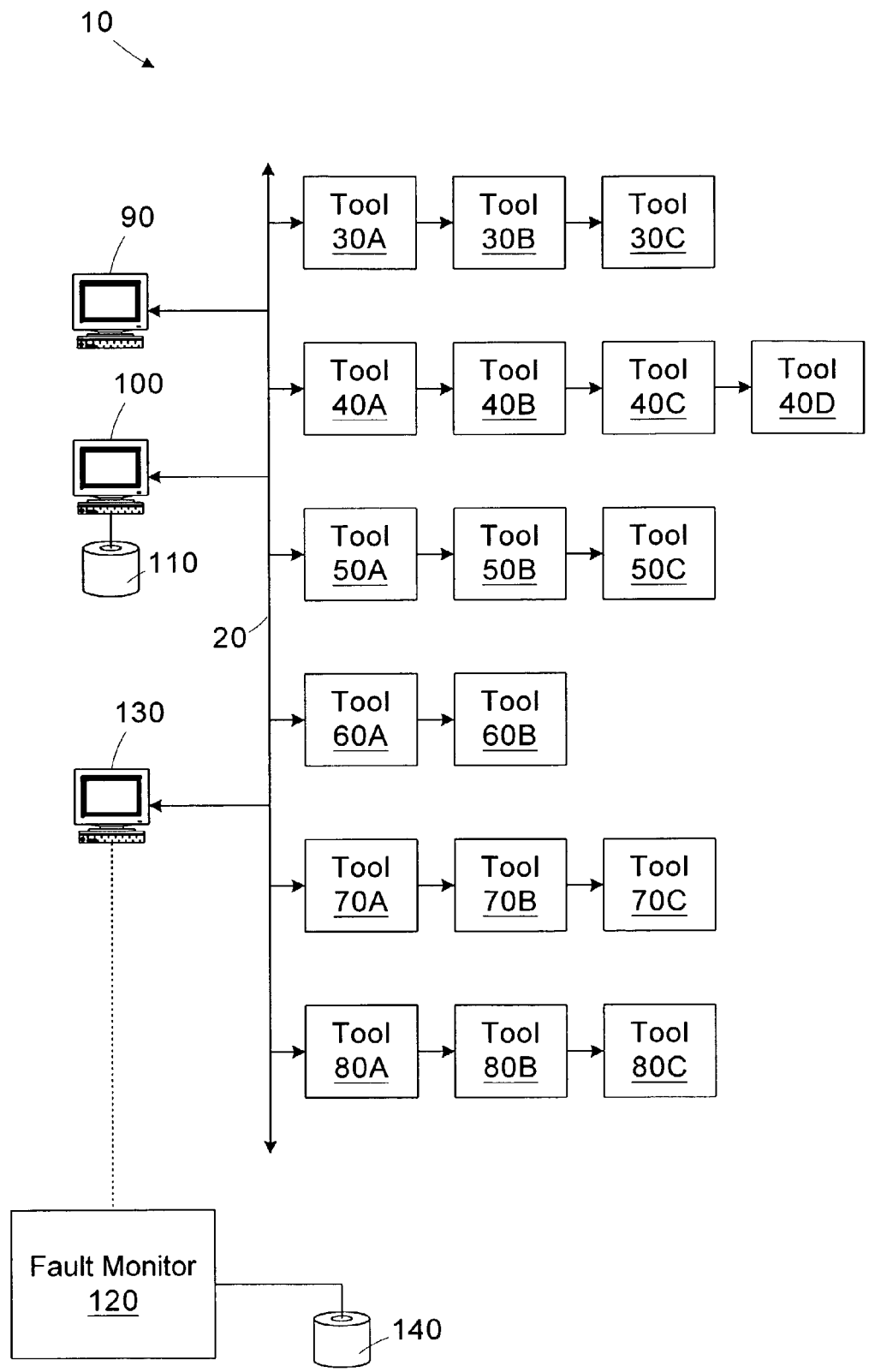
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. The techniques described herein may be applied to a variety of workpieces or manufactured items including, but not limited to microprocessors, memory devices, digital signal processors, application specific integrated circuits (ASICs), or other similar devices. The techniques may also be applied to workpieces or manufactured items other than semiconductor devices.

A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20. The tools 30–80 are grouped into sets of like tools, as denoted by lettered suffixes. For example, the set of tools 30A–30C represent tools of a certain type, such as a chemical mechanical planarization tool. A particular wafer or lot of wafers progresses through the tools 30–80 as it is being manufactured, with each tool 30–80 performing a specific function in the process flow. Exemplary processing tools for a semiconductor device fabrication environment, include metrology tools, photolithography steppers, etch tools, deposition tools, polishing tools, rapid thermal processing tools, implantation tools, etc. The tools 30–80 are illustrated in a rank and file grouping for illustrative purposes only. In an actual implementation, the tools may be arranged in any order or grouping. Additionally, the connections between the tools in a particular grouping are meant to represent only connections to the network 20, rather than interconnections between the tools.

A manufacturing execution system (MES) server 90 directs the high level operation of the manufacturing system 10. The MES server 90 monitors the status of the various entities in the manufacturing system 10 (i.e., lots, tools 30–80) and controls the flow of articles of manufacture (e.g., lots of semiconductor wafers) through the process flow. A database server 100 is provided for storing data related to the status of the various entities and articles of manufacture in the process flow. The database server 100 may store information in one or more data stores 110. The data may include pre-process and post-process metrology data, tool states, lot priorities, etc. As described in greater detail below, a fault monitor 120 operating on a computer 130 is provided for receiving notifications of fault conditions determined for wafer being processed in the manufacturing system 10. Upon receiving a fault notification message, the fault monitor 120 captures fault state data from various sources and stores the fault state data in a fault database 140 for future use in troubleshooting activities.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif.

The distribution of the processing and data storage functions amongst the different computers or workstations in FIG. 1 is generally conducted to provide independence and central information storage. Of course, different numbers of computers and different arrangements may be used.

The fault monitor 120 may be configured to receive fault information from a variety of sources. Fault detection and classification (FDC) data may be generated based on data from sensors or metrology tools relating to product or process conditions in the manufacturing system 10. Exemplary product data includes physical measurement data (e.g., line width, process layer thickness, trench depth, planarity, uniformity, photoresist pattern data, etc.), electrical measurement data (e.g., resistivity, contact resistance, dielectric constant, drive current, leakage current, etc.), or tool state data (e.g., tool state data for an etch tool may include gas flow, chamber pressure, chamber temperature, voltage, reflected power, backside helium pressure, RF tuning parameters, etc.). The particular makeup for the FDC data is application dependent and the application of the present invention is not limited to any particular type of FDC data. The specification of data sources for generating FDC data is well known to those of ordinary skill in the art. Various FDC techniques for processing the FDC data and determining fault conditions are well known to those of ordinary skill in the art, and for clarity and to avoid obscuring the present invention, they are not described in greater detail herein. Exemplary FDC techniques include control chart/control limit analysis, multivariate analysis, etc. An exemplary multivariate software tool for processing tool state data to determine tool health is ModelWare™ offered by Triant, Inc. of Nanaimo, British Columbia, Canada Vancouver, Canada. An exemplary system for monitoring tool health is described in U.S. patent application Ser. No. 09/863,822, entitled "METHOD AND APPARATUS FOR MONITORING TOOL HEALTH," filed in the names of Elfido Coss Jr., Richard J. Markle, and Patrick M. Cowan, that is assigned to the assignee of the present application and incorporated herein by reference in its entirety.

The particular construct of the fault notification message received by the fault monitor 120 depends on the particular fault condition being identified. The fault notification message may or may not include the wafers affected by the fault condition. For example, for fault data generated based on metrology analysis the wafer and/or lot identification numbers of the wafers being measured are typically known. Hence, a fault notification message derived from a metrology source would typically include wafer identification information.

For other fault sources, the fault notification message may only include the tool 30–80 that experienced the fault condition and a timestamp indicating when the fault occurred. In such cases, the fault monitor 120 determines the wafer identification information based on the tool identification information and the timestamp information. The MES server 90 maintains a schedule of the processing activities in the manufacturing system 10. The fault monitor 120 queries the MES server 90 to determine which wafer, lot, or lots of wafers (i.e., depending on the particular type of process tool 30–80) was being processed during or near the time the fault condition was determined. The timestamp of the fault notification message may not always correspond exactly to a time period during which a particular wafer was being processed. For example, the fault condition may be determined between processing runs based on a tool health analysis of the previous run. The fault monitor 120 may have to consider multiple wafers or lots processed during the time frame proximate the fault determination before deciding which wafer(s) to designate as being suspect. It may also be the case where wafers have been processed under the same conditions leading to the fault prior to the determination being made. The fault monitor 120 may also flag these subsequent wafers as being suspect. Along the same lines, wafers processed before the process run on which the fault determination was made may also be flagged by the fault monitor 120 as being suspect. In some cases, a fault analysis may not be conducted for each processing run. In such cases, all wafers processed since the last fault determination may be suspect.

Based on the wafer identification information supplied with the fault notification message or determined as described above, the fault monitor 120 collects fault state data associated with the determined fault condition. The fault state data includes the data that was analyzed to determine the fault condition. Again, the particular type of FDC data depends on the type of fault being determined. The fault state data may include both wafer state data and tool state data. Exemplary wafer state data includes metrology data regarding the characteristics of the wafer (e.g., physical dimensions, defect rate, electrical measurements, etc.), previous fault conditions, image data (e.g., optical or scanning electron microscope images for construction of a library of visual effects/fault events), context data (e.g., process step, process history (tools 30–80 employed)), etc. Exemplary tool state data includes the data collected during the processing run (i.e., as described above), tool maintenance history, prior tool faults, etc.

In some cases, the data desired for inclusion in the fault record may not be available. For example, metrology data or image data may not be collected for every wafer. The fault monitor 120 may determine, based in part on the particular type of fault condition determined, that additional data would be useful in troubleshooting the fault. Accordingly, the fault monitor 120 may send a request to the MES server 90 to schedule the desired activities for collecting additional metrology or image data. In one embodiment, the MES server 90 may notify the fault monitor 120 when the requested data is available. In another embodiment, the fault monitor 120 may maintain a queue of requested activities and periodically check to identify when the data becomes available.

The fault monitor 120 generates a fault record in the fault database 140 that is available for future analysis and troubleshooting of the fault condition. The fault record may include fault state data associated with multiple wafers and/or multiple process tools 30–80 depending on how precisely the fault monitor 120 can narrow down the suspect wafers and/or tools 30–80. The fault monitor 120 may update the fault record as additional information becomes available. A user may also instruct the fault monitor 120 to update the fault record when the troubleshooting activities commence to determine if additional data that was not present at the time the fault was captured is now available.

Figure 2:
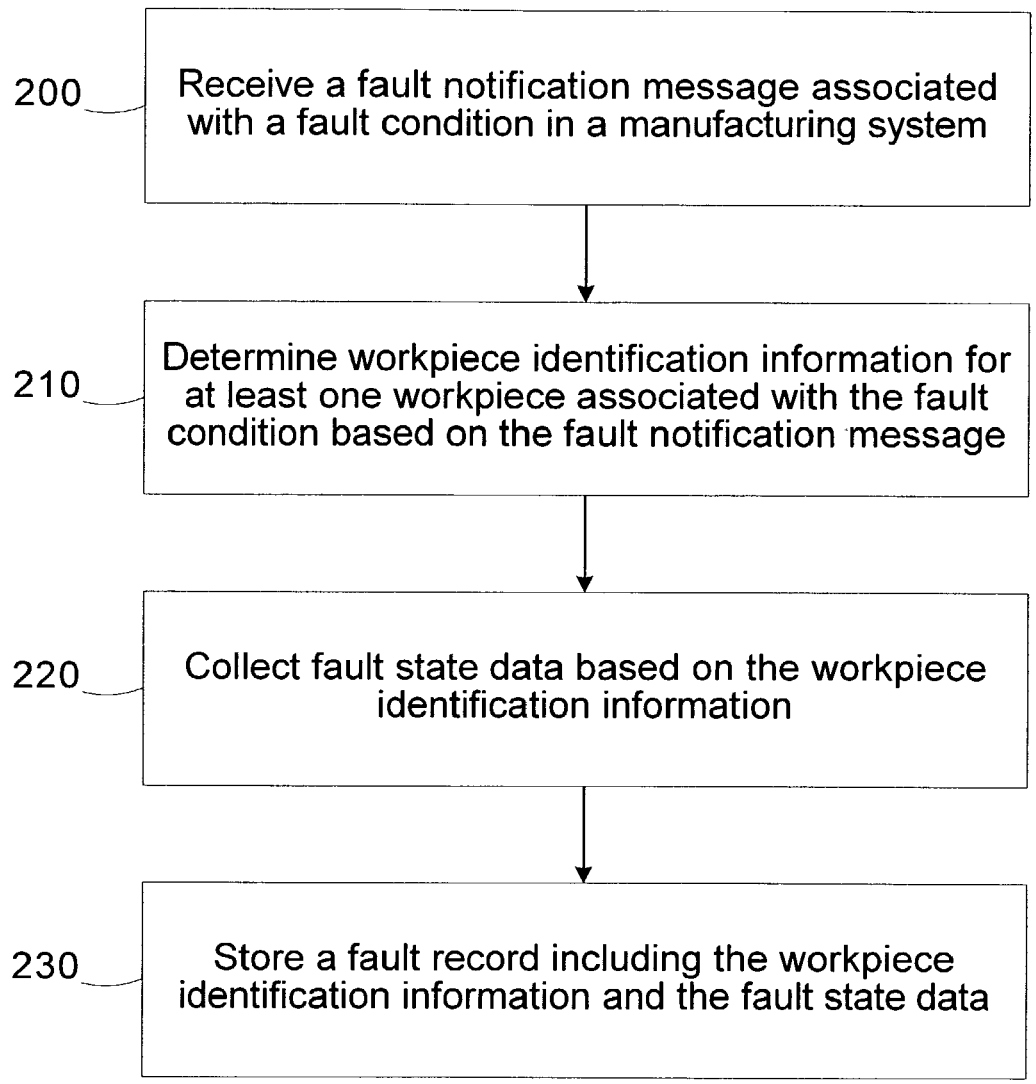
FIG. 2 is a simplified flow diagram of a method for capturing fault state data in accordance with another illustrative embodiment of the present invention.

Turning now to FIG. 2, a simplified flow diagram of a method for capturing fault state data in accordance with another illustrative embodiment of the present invention is provided. In block 200, a fault notification message associated with a fault condition in a manufacturing system is received. In block 210, workpiece identification information is determined for at least one workpiece associated with the fault condition based on the fault notification message. In block 220, fault state data is collected based on the workpiece identification information. In block 230, a fault record including the workpiece identification information and the fault state data is stored.

The capturing and storage of fault state data, as described above, has numerous advantages. The fault state data is collected immediately after determination of the fault condition to reduce the likelihood that the data would not be available when troubleshooting actually occurs. The automated data collection process also reduces the time required to conduct troubleshooting activities because the relevant data has been previously gathered. The automated data gathering system also allows data (e.g., metrology or image) that is not presently available to be collected and stored prior to commencement of the troubleshooting activities.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   receiving a fault notification message associated with a fault condition in a manufacturing system;
   determining workpiece identification information for at least one workpiece associated with the fault condition based on the fault notification message;
   collecting fault state data based on the workpiece identification information; and
   storing a fault record including the workpiece identification information and the fault state data.

2. The method of claim 1, wherein the fault notification message includes the workpiece identification information, and determining the workpiece identification information further comprises extracting the workpiece identification information from the fault notification message.

3. The method of claim 1, wherein the fault notification message includes process tool identification information associated with a process tool related to the fault condition, and determining the workpiece identification information further comprises identifying at least one workpiece processed by the process tool during a time period proximate the fault condition.

4. The method of claim 1, wherein collecting the fault state data further comprises collecting workpiece state data.

5. The method of claim 4, wherein collecting the workpiece state data further comprises collecting metrology data associated with the workpiece.

6. The method of claim 4, wherein collecting the workpiece state data further comprises collecting context data associated with the workpiece.

7. The method of claim 6, wherein collecting the context data further comprises collecting at least one of process step data and processing history data.

8. The method of claim 1, wherein collecting the fault state data further comprises collecting process tool state data.

9. The method of claim 8, wherein collecting the process tool state data further comprises collecting data associated with a process run of the process tool executing proximate the fault condition.

10. The method of claim 8, wherein collecting the process tool state data further comprises collecting at least one of tool maintenance history and tool fault history.

11. The method of claim 1, further comprising initiating a scheduling request to gather additional fault state data responsive to the fault notification message.

12. The method of claim 11, wherein initiating the scheduling request further comprises initiating a request for metrology data associated with the workpiece.

13. The method of claim 11, wherein initiating the scheduling request further comprises initiating a request for image data associated with the workpiece.

14. A manufacturing system, comprising:
    a plurality of tools for processing workpieces;
    a fault database;
    a fault monitor configured to receive a fault notification message associated with a fault condition in the manufacturing system, determine workpiece identification information for at least one of the workpieces associated with the fault condition based on the fault notification message, collect fault state data based on the workpiece identification information, and store a fault record including the workpiece identification information and the fault state data in the fault database.

15. The system of claim 14, wherein the fault notification message includes the workpiece identification information.

16. The system of claim 14, wherein the fault notification message includes process tool identification information associated with a process tool related to the fault condition, and the fault monitor is further configured to identify at least one of the workpieces processed by the process tool during a time period proximate the fault condition.

17. The system of claim 14, wherein the fault state data further comprises workpiece state data.

18. The system of claim 17, wherein the workpiece state data further comprises metrology data associated with the workpiece.

19. The system of claim 17, wherein the workpiece state data further comprises context data associated with the workpiece.

20. The system of claim 19, wherein the context data further comprises at least one of process step data and processing history data.

21. The system of claim 14, wherein the fault state data further comprises process tool state data.

22. The system of claim 21, wherein the process tool state data further comprises data associated with a process run of the process tool executing proximate the fault condition.

23. The system of claim 21, wherein the process tool state data further comprises at least one of tool maintenance history and tool fault history.

24. The system of claim 14, wherein the fault monitor is further configured to initiate a scheduling request to gather additional fault state data responsive to the fault notification message.

25. The system of claim 24, wherein the scheduling request further comprises a request for metrology data associated with the workpiece.

26. The system of claim 24, wherein the scheduling request further comprises a request for image data associated with the workpiece.

27. A system, comprising:
    means for receiving a fault notification message associated with a fault condition in a manufacturing system;
    means for determining workpiece identification information for at least one workpiece associated with the fault condition based on the fault notification message;
    means for collecting fault state data based on the workpiece identification information; and
    means for storing a fault record including the workpiece identification information and the fault state data.

* * * * *